(12) United States Patent
Chu et al.

(10) Patent No.: US 6,487,084 B1
(45) Date of Patent: Nov. 26, 2002

(54) PRINTED CIRCUIT BOARD COMPRISING AN EMBEDDED FUNCTIONAL ELEMENT THEREIN

(75) Inventors: Edward Fu-Hua Chu, Taipei (TW); Yun-Ching Ma, Taipei Hsien (TW); David Shau-Chew Wang, Taipei (TW)

(73) Assignee: Polytronics Technology Corporation, Hsinchu (TW)

( * ) Notice: Subject to any disclaimer, the term of this patent is extended or adjusted under 35 U.S.C. 154(b) by 0 days.

(21) Appl. No.: 10/072,505

(22) Filed: Feb. 5, 2002

(30) Foreign Application Priority Data

Mar. 20, 2001 (TW) .................................. 90204687 U

(51) Int. Cl.⁷ ............................................. H05K 1/18
(52) U.S. Cl. ..................... 361/762; 174/255; 174/256; 174/260
(58) Field of Search ................. 174/255–260; 361/761–764; 337/182

(56) References Cited

U.S. PATENT DOCUMENTS

| | | | |
|---|---|---|---|
| 5,089,688 A | * | 2/1992 | Fang et al. ............... 219/209 |
| 6,239,977 B1 | * | 5/2001 | Price et al. ............... 337/297 |
| 6,300,859 B1 | * | 10/2001 | Myong et al. ............. 337/14 |

FOREIGN PATENT DOCUMENTS

| | | | | |
|---|---|---|---|---|
| DE | 3320730 A1 | * | 7/1984 | ......... H01H/37/74 |
| GB | 2184291 A | * | 6/1987 | ......... H01L/23/54 |

* cited by examiner

Primary Examiner—Kamand Cuneo
Assistant Examiner—Jeremy Norris
(74) Attorney, Agent, or Firm—Seyfarth Shaw

(57) ABSTRACT

A PCB comprising a substrate, at least one circuit layer and at least one insulating layer, characterized in that the PCB further comprises at least one embedded functional material such as a PTC, and NTC and ZTC material. If the PTC material is applied in the present invention, a normal resistance of the present invention will be substantially smaller than that of the conventional PTC protection apparatus since the area of the PTC material of the present invention is larger than that of the conventional PTC protection apparatus. Moreover, through an electrically conductive hole, an upper electrode and a lower electrode respectively lying on top and bottom surfaces of the functional material are respectively connected with an apparatus mounted on a surface of the PCB to form a conductive circuit. Thus, at least one over-current protection apparatus which is usually mounted on the surface of the PCB is eliminated, and the surface utilization rate of the PCB is improved.

25 Claims, 6 Drawing Sheets

PRINTED CIRCUIT BOARD COMPRISING AN EMBEDDED FUNCTIONAL ELEMENT THEREIN

BACKGROUND OF THE INVENTION

1. Field of the Invention

The present invention relates to a printed circuit board (PCB), and more particularly, to a printed circuit board comprising an embedded internal functional element.

2. Description of the Prior Art

Since the portable electronic products (such as cellular phone, notebook computer, hand-held camera and personal digital assistant, etc.) are getting more and more popular nowadays, over-current protection apparatuses for avoiding the occurrence of over-current or the over-temperature of the portable electric products are increasingly important.

In the protection apparatuses, a positive temperature coefficient (PTC) over-current protection apparatus is used extensively because of its characteristics of being resettable, sensitive to temperature and stable in reliability. Thus, the PTC over-current protection apparatus has been widely applied to protect batteries, especially second batteries, such as the nickel-hydrogen battery or the lithium battery, etc.

A PTC conductive composition material (PTC material) is utilized as a current sensitive element of the PTC over-current protection apparatus, because the resistance of the PTC material is very sensitive to temperature variation. Because the resistance of the PTC material is very low at its normal temperature, the circuit can operate normally. However, if the over-current or over-temperature of the battery occurs because of improper usage, the resistance of the PTC material will increase immediately for at least ten thousand times (such as $10^4$ ohm) so that the PTC material will be at a high-resistance state. Therefore, the over current will be counterchecked and thereby the object of protecting circuit elements of the battery is achieved.

FIG. 1 is a schematic diagram showing connection of a conventional PTC over-current protection apparatus. One terminal of the PTC over-current protection apparatus 12, mounted on the surface of a printed circuit board 10, is connected to a power supply 11 and the other terminal is connected to a first integrated circuit 13. Generally, the normal value of the electrical resistance of the PTC over-current protection apparatus 12 is obtained according to the conventional formula:

$$R = \frac{\rho \times l}{A},$$

in which R is the resistance in ohms, ρ is the resistivity in ohms-cm of the PTC material, l is the length between two electrodes and A is the effective area of the protection apparatus 12. Since the size of the printed circuit board of the portable electronic product becomes smaller and smaller, the footprint of the PTC over-current protection apparatus 12 mounted on the printed circuit board also needs to be decreased comparatively. According to the above formula, as the normal resistance of the PTC over-current protection apparatus 12 is increased, the power consumption will increase such that the working voltage of the first integrated circuit 13 connected with the protection apparatus will be dropped.

Furthermore, the printed circuit board has the trend of small size and high density at the present day. Therefore, the number of internal layers of the PCB has increased to be even more than 12, especially in small, thin and light products, such as cellular phone, personal digital assistant (PDA) and digital camera, etc. Generally, a main process of processes for manufacturing the multi-layer printed circuit board is a so-called build-up process. The build-up process forms the printed circuit board by stacking a circuit layer and an insulation layer one by one, such that a multi-layer PCB having vias and high density is formed.

FIGS. 2(a) to 2(e) depicts a conventional build-up process. In FIG. 2(a), a substrate 20 is provided, which is composed of a glass fiber and a resin. A first conductive layer 21, such as a copper foil, is applied to the surface of the substrate 20. In FIG. 2(b), the first conductive layer 21 is etched by a chemical method for forming an isolating area 22. In FIG. 2(c), an insulating layer 23 is applied to the surface of the first conductive layer 21. In FIG. 2(d), the insulating layer 23 is etched by a laser or chemical method for forming a conductive via 24. In FIG. 2(e), a second conductive layer 25 is applied to the insulating layer 23 by a method of plating or electroless plating. In the above-mentioned plating process, the conductive via 24 will be filled with a conductive material to conduct the first conductive layer with the second conductive layer. Therefore, the conductive layer and the insulating layer can be stacked one by one if the above steps are repeated over and over, and thus a multi-layer printed circuit board is formed. Moreover, any two conductive layers of the printed circuit board can also be connected by a electrically conductive hole. The electrically conductive hole is formed by mechanical drilling and plating the hole, electrolessly plating the hole or filling the hole with a conductive paste so as to connect two conductive layers together. FIG. 3 depicts a diagram of the electrically conductive hole; wherein a first conductive layer 31 is connected to a second conductive layer 32 and a second terminal point 36 through a first conductive hole 33. However, if the first conductive layer 31 needs to be connected to a first terminal point 35 without being connected to a second conductive layer 32, an etched area 37 is formed around a second conductive hole 34 in the second conductive layer 32, and thus the second conductive hole 34 and the second conductive layer 32 are isolated.

Since the size of the printed circuit board 10 is decreased, the area for mounting the electrical apparatus is limited. Therefore, how to increase the utilization area of the printed circuit board is a critical problem to be tackled with. For this purpose, the present invention discloses a printed circuit board having an embedded internal over-current protection apparatus to increase the utilization area of the PCB and decrease the normal resistance. Moreover, the surface of the PCB can accommodate more devices, since the over-current protection apparatus mounted on the PCB surface is not necessary. On the other hand, an external damage to the surface mount over-current protection apparatus will be avoided.

SUMMARY OF THE INVENTION

A major object of the present invention is to provide a printed circuit board (PCB) with an increased area of an embedded internal functional element for the benefit of decreasing the normal resistance. Thus, the power consumption of this invention is much lower than an over-current protection apparatus being surface mounted on the PCB surface and the dropping of the working voltage will also be significantly reduced.

A second object of the present invention is to make the embedded functional element constituted by one or more than one internal layers of the printed circuit board. Since this embedded functional element design utilizes more effective area of over-current protection apparatus without utilizing any area of PCB surface, the resulted electrical rating of embedded functional element in the printed circuit board such as maximum working current is higher.

A third object of the present invention is to make the functional element to constitute a resistive or sensing element, and thus the number of the apparatuses mounted on the surface of the PCB is decreased and the utilization rate of the PCB is improved.

In order to achieve the above objects and to avoid the disadvantages of the prior art, the present invention discloses a PCB, characterized in that besides the conductive layer and the insulating layer, the PCB further comprises at least one functional element either current-sensitive or temperature-sensitive layer, such as the positive temperature coefficient (PTC) element, negative temperature coefficient (NTC) element, or zero temperature coefficient (ZTC) element. The functional element comprises a functional material, an upper electrode and a lower electrode, and the functional material is selected from the group consisting of PTC material, ZTC material and NTC material. If the PTC element is applied in the present invention, the normal resistance of the present invention will be smaller than that of conventional PTC protection apparatus since the area of the PTC element of the present invention is larger than that of conventional PTC protection apparatus. Moreover, through an electrically conductive hole, an upper electrode and a lower electrode respectively lying on the top and bottom surfaces of the functional PTC element are respectively connected with an apparatus mounted on the surface of the PCB to form a connecting circuit. Thus, the PTC overcurrent protection apparatus which is usually mounted on the surface of the PCB is eliminated, and the surface utilization rate of the PCB will be improved while the over-current protection mechanism through the entire circuitry is still maintained.

The foregoing and other objects and advantages of the invention and the manner in which the same are accomplished will be clearly shown based on the following detailed description taken in conjunction with the accompanying drawings.

DETAILED DESCRIPTION OF THE INVENTION

Figure 1:
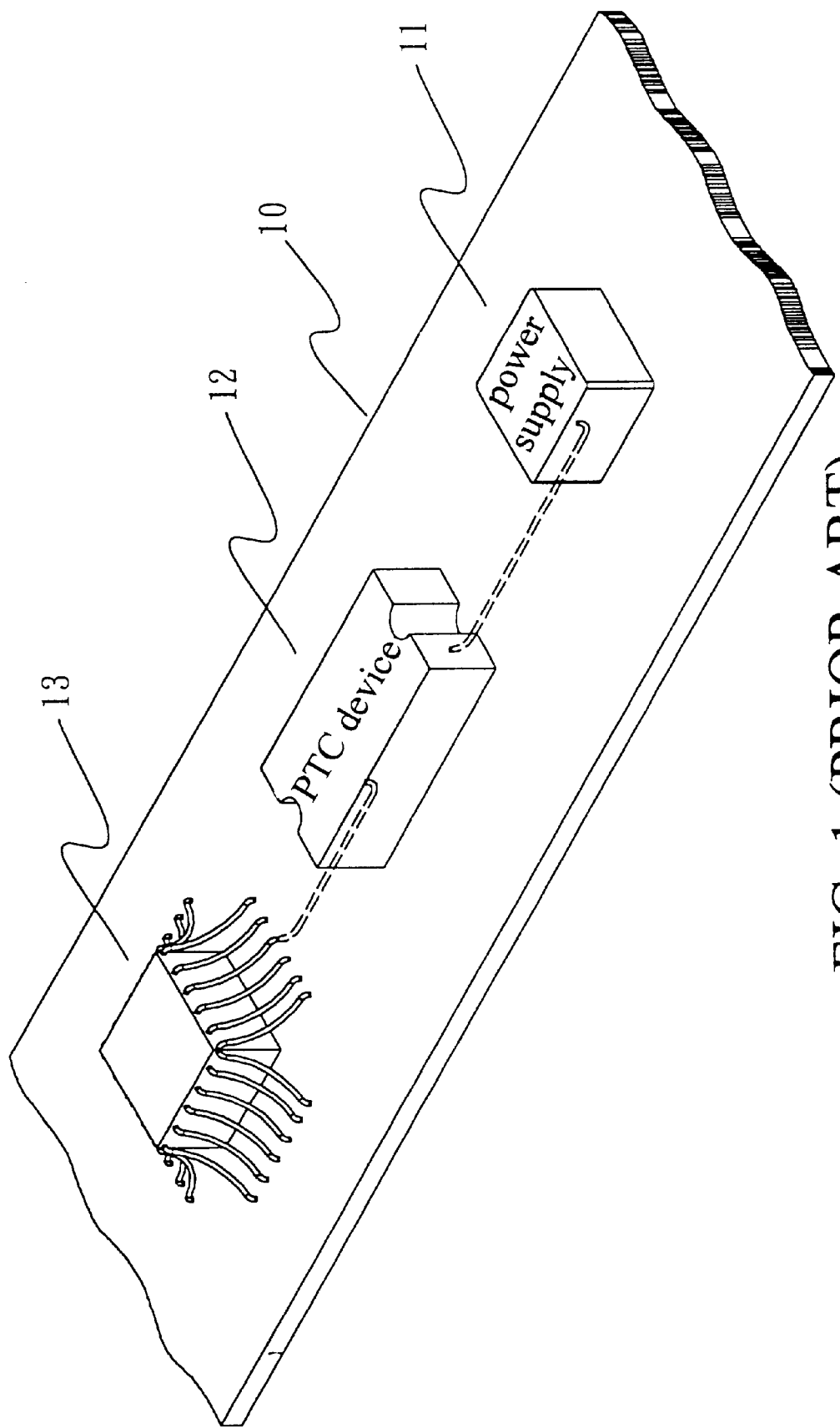
FIG. 1 depicts a schematic diagram showing connection of a conventional PTC over-current protection apparatus.
Figure 2A:
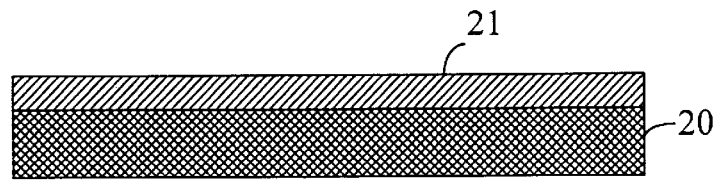
FIGS. 2(a) to 2(e) depicts the steps of a conventional build-up process.
Figure 2B:
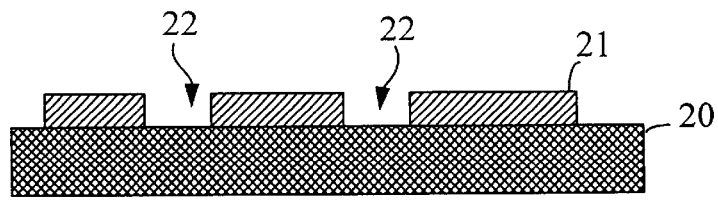
Figure 2C:
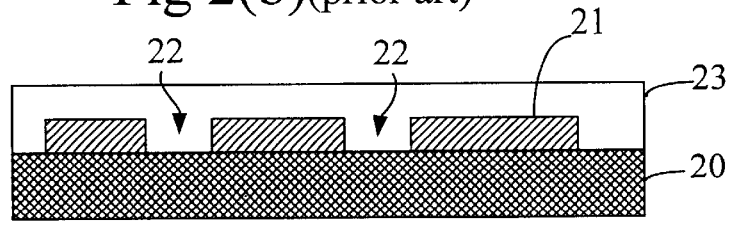
Figure 2D:
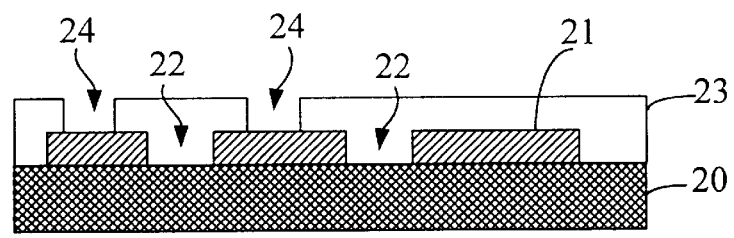
Figure 2E:
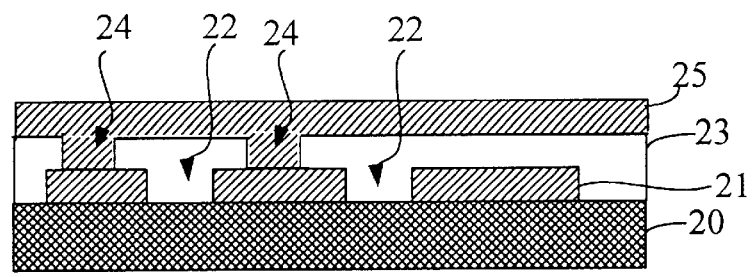
Figure 3:
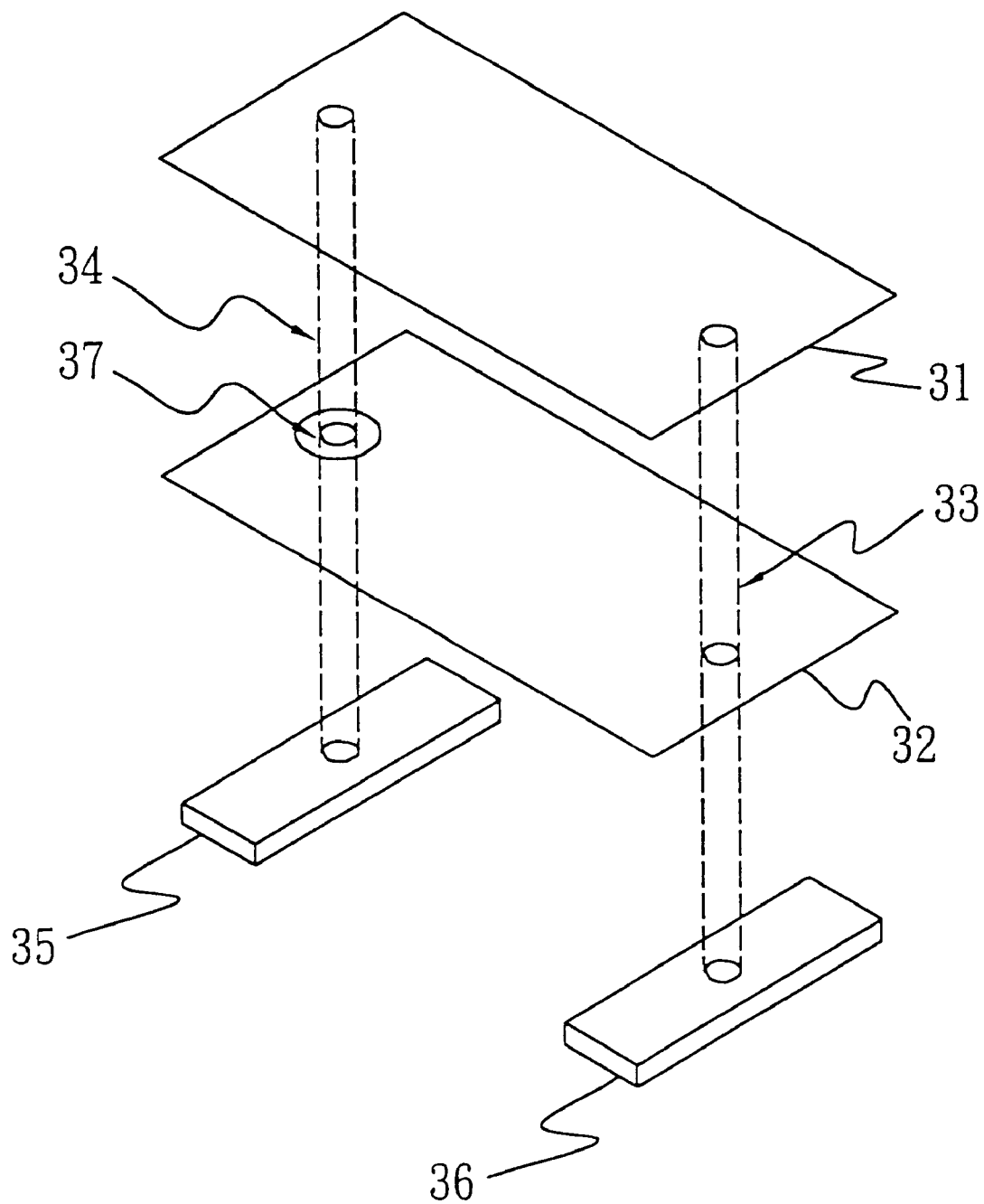
FIG. 3 depicts the diagram of a conventional electrically conductive hole.
Figure 4:
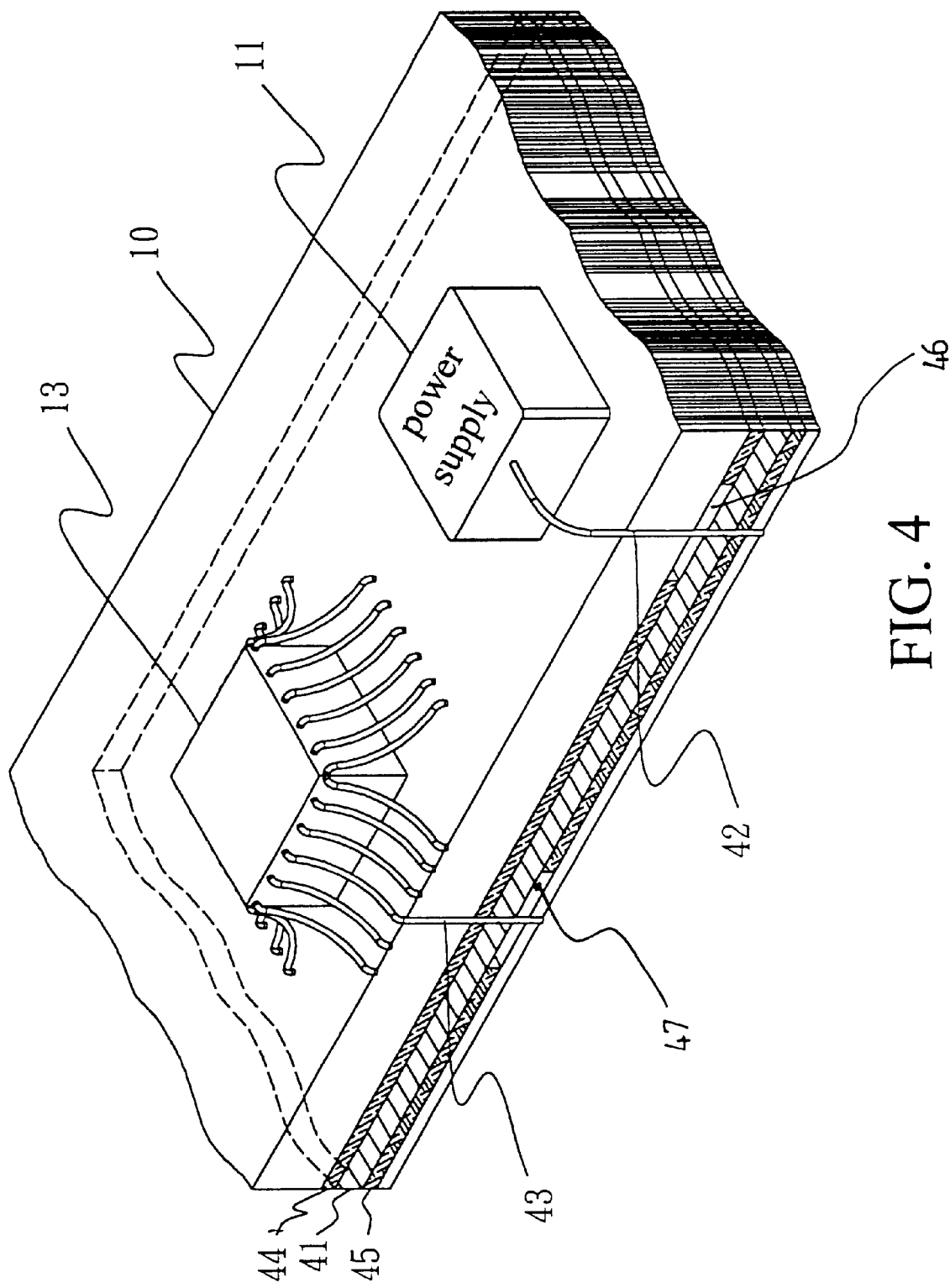
FIG. 4 depicts a perspective view of a first embodiment of the present invention.

FIG. 4 depicts a perspective view of a first embodiment of the present invention. One of the technical features of the present invention is to make the functional element be a part of a printed circuit board 10. The functional element layer of the present invention is not limited to one layer or multi-layers. In one preferred embodiment of the present invention, the functional element is a PTC element. The printed circuit board 10 comprises an embedded internal PTC material layer 41, which is covered with an upper electrode 44 and a lower electrode 45 respectively on top and bottom surfaces of the PTC material layer 41. The function of the combination of the PTC material layer 41, the upper electrode 44 and the lower electrode 45 is equivalent to the function of the PTC over-current protection apparatus 12 shown in FIG. 1. A power supply 11 is connected to the lower electrode 45 through a first electrically conductive hole 42 and then to the upper electrode 44 through the PTC material layer 41. The upper electrode 44 is connected to a first integrated circuit device 13 through a second electrically conductive hole 43. The first electrical conductive hole 42 is isolated from the upper electrode 44 by a first etched area 46 and the second electrically conductive hole 43 is also isolated from the lower electrode 45 by a second etched area 47, to define a connection between the power supply 11 and the first integrated circuit device 13. Therefore, the circuit from the power supply 11 through the PTC material 41 to the first integrated circuit 13 is equivalent to the circuit of FIG. 1. The first and the second electrically conductive holes 42, 43 are formed by mechanical drilling and then electro-plating the hole, electroless plating the hole or filling the hole with a conductive paste. The first etched area 46 and the second etched area 47 are formed by a chemical etching process. In addition, the process for forming the PCB of the present invention is unrestricted, and it can thus be the above-mentioned build-up process or the vias or the other related process.

The PTC material layer 41 is made of a positive temperature coefficient conductive composition comprising a polymer and a conductive filler. The polymer of the PTC material is a crystalline polymer selected from the group consisting of polyethylene, polypropylene, polyoctylene, polyvinylidene chloride and a mixture thereof. The conductive filler is dispersed in the above polymer and is selected from the group consisting of carbon black, metal powder, conductive ceramic powder and a mixture thereof. To improve sensitivity and physical properties of the PTC material layer, the PTC conductive composition further comprises an additive, including a photo initiator, cross-link agent, coupling agent, dispersing agent, stabilizer, anti-oxidant and nonconductive anti-arcing filler. The upper electrode 44 and the lower electrode 45 are both made of a metal foil, such as copper, nickel, aurum and the alloy thereof Those electrodes 44 and 45 are formed by electro-plating, electroless plating or hot pressing technology, in which the metal foil in the hot pressing process is attached to the PTC material layer with its micro-rough surface.

Since the conventional PTC over-current protection apparatus 12 is replaced by the combination of the embedded PTC material layer 41, the upper electrode 44 and the lower electrode 45, the amount of the apparatuses mounted on the surface of the PCB is decreased and thus the utilization rate of the PCB surface is increased. Moreover, because the surface area of the PTC element is increased, the normal resistance measured according to the above-mentioned conventional formula is decreased substantially. Thus, the increase in the power consumption of the entire circuitry and the decrease in the supplied working voltage of the first integrated circuit are avoided. In addition, the PTC material layer of the PCB 10 can be made of at least two adjacent or non-adjacent layers. The adjacent or non-adjacent PTC material layers can be connected in parallel for further decreasing the normal resistance.

Figure 5:
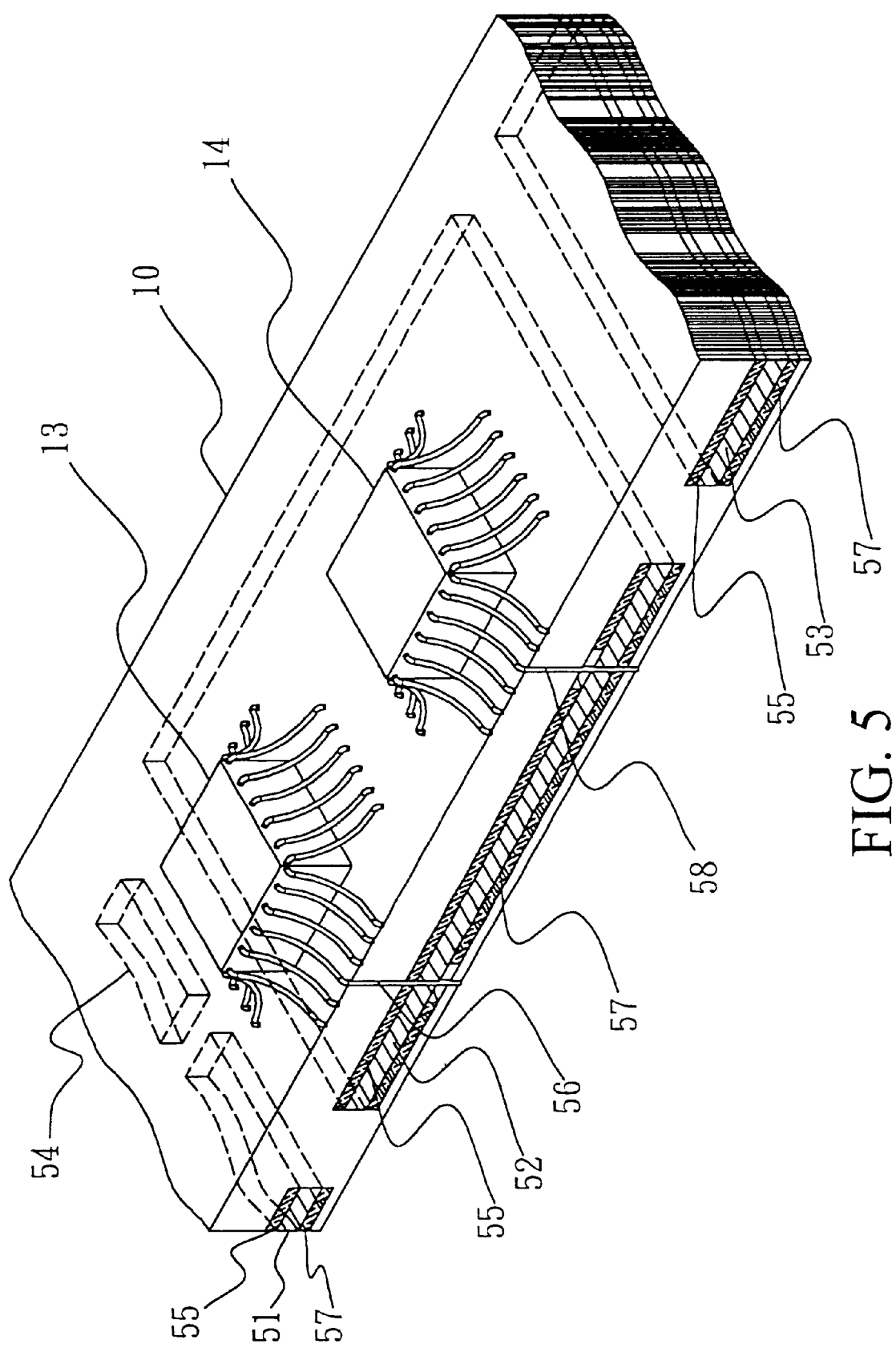
FIG. 5 depict a perspective view of a second embodiment of the present invention.

FIG. 5 depicts a perspective view of a second embodiment of the present invention. The PTC material layer 41 shown in FIG. 4 is divided into several sections according to the requirement of resistance and location. For example, the PTC material layer is divided into a first PTC material section 51, a second PTC material section 52, a third PTC material section 53 and a fourth PTC material section 54. Each of the PTC material sections executes not only the over-current protection function mentioned above but also the resistance function. For example, the first integrated circuit 13 is electrically connected to an upper electrode 55 through a third conductive hole 56 and a second integrated circuit 14 is electrically connected to a lower electrode 57 through a fourth conductive hole 58. Thus, an electrical circuit is formed from the first integrated circuit 13 to the second integrated circuit 14 due to the normal resistance effect of the second embedded PTC section 52. In other words, the PTC section characteristics of the present invention can be applied to replace conventional resistors to increase the surface utilization rate of the PCB 10.

Figure 6:
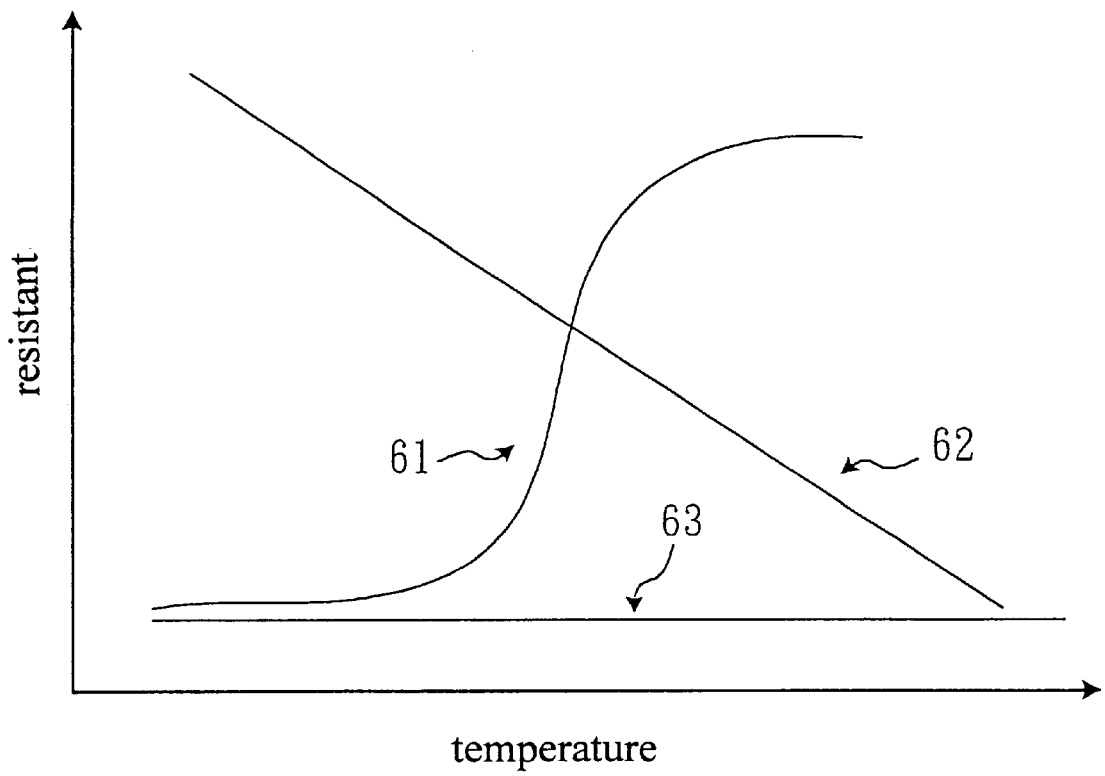
FIG. 6 depicts a temperature-resistance diagram for the PTC, NTC and ZTC material.

In another preferred embodiment of the present invention, the functional material layer 41 is made of the negative temperature coefficient (NTC) conductive composition or the zero temperature coefficient (ZTC) conductive composition. The NTC conductive composition comprises a polymer and a conductive filler. The polymer of the composition is a crystalline polymer or a noncrystalline polymer, which is selected from the group consisting of polyethylene, polypropylene, polyoctylene, polyvinylidene chloride and a mixture thereof. The conductive filler is dispersed in the polymer and is selected from the group consisting of a carbon black, metal powder, conductive ceramic powder and a mixture thereof. Moreover, the ZTC conductive composition comprises a polymer and a conductive filler. The polymer is a crystalline polymer or a noncrystalline polymer, which is selected from the group consisting of a polyethylene, polypropylene, polyoctylene, polyvinylidene chloride and a mixture thereof The conductive filler is dispersed in the polymer and is selected from the group consisting of a carbon black, metal powder, conductive ceramic powder and a mixture thereof FIG. 6 depicts a temperature-resistance diagram for the PTC NTC and ZTC materials. Therefore, the PCB of the present invention has not only the function of the resistor but also the function of the temperature sensor.

The methods and features of this invention have been sufficiently described in the above examples and descriptions. It should be understood that any modifications or changes without departing from the spirits of the invention are intended to be covered in the protection scopes of the invention.

What is claimed is:

1. A printed circuit board (PCB), comprising a substrate, at least one circuit layer and at least one insulating layer, characterized in that the PCB further comprises at least one embedded PTC material layer and an upper electrode and a lower electrode respectively lying on top and bottom surfaces of the at least PTC material layer, and the upper electrode and the lower electrode are electrically connected to an apparatus mounted on a surface of the PCB through an electrically conductive hole to form a conductive circuit.

2. The printed circuit board of claim 1, which is formed by a build-up process.

3. The printed circuit board of claim 1, wherein the electrical conductive hole used for connecting the upper electrode or the lower electrode to the apparatus mounted on the surface of the PCB is formed by mechanical drilling and then electroplating the hole, electroless plating the hole or filling the hole with a conductive paste.

4. The printed circuit board of claim 1, wherein the PTC material layer is divided into several sections according to the requirements of a resistance value and a location.

5. The printed circuit board of claim 1, wherein the PTC material comprises a polymer and a conductive filler.

6. The printed circuit board of claim 5, wherein the polymer is selected from the group consisting of polyethylene, polypropylene, polyoctylene, polyvinylidene chloride and a mixture thereof.

7. The printed circuit board of claim 5, wherein the conductive filler is selected from the group consisting of a carbon black, metal powder, conductive ceramic powder and a mixture thereof.

8. The printed circuit board of claim 1, wherein the material of the upper and the lower electrodes are selected from the group consisting of copper, nickel, aurum and an alloy thereof.

9. The printed circuit board of claim 1, wherein the upper electrode and the lower electrode are formed by a electroplating or electroless plating process.

10. The printed circuit board of claim 1, wherein the upper electrode and the lower electrode are formed by attaching a rough surface of a metal foil to the PTC material layer and then being processed by hot pressing.

11. The printed circuit board of claim 1, wherein two embedded adjacent or non-adjacent PTC material layers can be connected in parallel for decreasing a normal resistance value.

12. A printed circuit board (PCB) comprising a substrate, at least one circuit layer and at least one insulating layer, characterized in that the PCB further comprises at least one embedded NTC material layer, an upper electrode and a lower electrode respectively lying on top and bottom surfaces of the NTC material layer and the upper electrode and the lower electrode are electrically connected to an apparatus mounted on a surface of the PCB through an electrically conductive hole for forming a conductive circuit.

13. The printed circuit board of claim 12, wherein the electrically conductive hole used for connecting the upper electrode or the lower electrode with the apparatus mounted on the surface of PCB is formed by mechanical drilling and then electroplating the hole, electroless plating the hole or filling the hole with a conductive paste.

14. The printed circuit board of claim 12, wherein the NTC material layer is divided into several sections according to the requirements of a resistance value and a location.

15. The printed circuit board of claim 12, wherein the NTC material comprises a polymer and a conductive filler.

16. The printed circuit board of claim 15, wherein the polymer is a crystalline polymer or a noncrystallinee polymer.

17. The printed circuit board of claim 15, wherein the conductive filler is selected from the group consisting of a carbon black, metal powder, conductive ceramic powder and a mixture thereof.

18. The printed circuit board of claim 12, wherein two embedded adjacent or non-adjacent NTC material layers can be connected in parallel for decreasing a normal resistance value.

19. A printed circuit board (PCB) comprising a substrate, at least one circuit layer and at least one insulating layer, characterized in that the PCB further comprises at least one embedded ZTC material layer, an upper electrode and a lower electrode respectively lying on top and the bottom surfaces of the ZTC material layer, and the upper electrode and the lower electrode are electrically connected to an apparatus mounted on the surface of the PCB through an electrically conductive hole for forming a conductive circuit.

20. The printed circuit board of claim 19, wherein the electrical conductive hole used for connecting the upper electrode or the lower electrode with the apparatus mounted on the surface of PCB is formed by mechanical drilling and then electroplating the hole, electroless plating the hole or filling the hole with a conductive paste.

21. The printed circuit board of claim 19, wherein the ZTC material layer is divided into several sections according to the requirements of a resistance value and a location.

22. The printed circuit board of claim 19, wherein the ZTC material comprises a polymer and a conductive filler.

23. The printed circuit board of claim 22, wherein the polymer is a crystalline polymer or a noncrystalline polymer.

24. The printed circuit board of claim 22, wherein the conductive filler is selected from the group consisting of a carbon black, metal powder, conductive ceramic powder and a mixture thereof.

25. The printed circuit board of claim 19, wherein two embedded adjacent or non-adjacent ZTC material layers can be connected in parallel for decreasing a normal resistance value.

* * * * *